United States Patent
Berry et al.

(10) Patent No.: US 6,937,632 B2
(45) Date of Patent: Aug. 30, 2005

(54) INTEGRATED SEMICONDUCTOR LASER AND WAVEGUIDE DEVICE

(75) Inventors: Graham Michael Berry, Bury St. Edmunds (GB); Wilfred Booij, Nordy (NO); Mark Silver, Ipswich (GB)

(73) Assignee: Agilent Technologies, Inc., Palo Alto, CA (US)

( * ) Notice: Subject to any disclaimer, the term of this patent is extended or adjusted under 35 U.S.C. 154(b) by 263 days.

(21) Appl. No.: 10/459,716

(22) Filed: Jun. 12, 2003

(65) Prior Publication Data

US 2004/0062467 A1 Apr. 1, 2004

(30) Foreign Application Priority Data

Jun. 12, 2002 (EP) .............................. 02254072

(51) Int. Cl.⁷ ................................................ H01S 5/00
(52) U.S. Cl. .................... 372/43; 372/45; 372/46; 372/39; 257/79; 257/94; 257/98
(58) Field of Search ..................... 372/43–50, 39; 257/79, 94, 98, 184, 431

(56) References Cited

U.S. PATENT DOCUMENTS

| | | | | |
|---|---|---|---|---|
| 4,759,023 A | * | 7/1988 | Yamaguchi | 438/23 |
| 5,717,710 A | * | 2/1998 | Miyazaki et al. | 372/50 |
| 5,805,628 A | * | 9/1998 | Karakida et al. | 372/46 |
| 5,822,349 A | * | 10/1998 | Takaoka et al. | 372/46 |
| 6,360,048 B1 | * | 3/2002 | Yamada | 385/131 |
| 6,509,580 B2 | * | 1/2003 | Charles | 257/27 |
| 6,678,299 B1 | * | 1/2004 | Inaba et al. | 372/45 |
| 6,782,022 B2 | * | 8/2004 | Funabashi et al. | 372/45 |
| 6,813,068 B2 | * | 11/2004 | Hamamoto | 359/344 |
| 2004/0057646 A1 | * | 3/2004 | Berry et al. | 385/12 |

FOREIGN PATENT DOCUMENTS

EP           0 314 372           5/1998

OTHER PUBLICATIONS

Patent Abstracts of Japan—vol. 2000, no. 9 (Oct. 13, 2000) & JP 2000 156539 A (NEC Corp) Jun. 6, 2000.

* cited by examiner

Primary Examiner—Min Sun Harvey
Assistant Examiner—Delma R. Florez-Ruiz

(57) ABSTRACT

A buried heterojunction laser optically coupled with a buried waveguide electro-absorption (EA) optical modulator via an active layer is fabricated on a substrate carrying a number of deposited semiconductor layers. The laser component includes a laser current conduction region and an adjacent laser current confinement region. The waveguide component includes a waveguide current confinement region comprising first and second current blocking structures formed from different grown semiconductor layers. An extension of the first current blocking structure is interposed between the second current blocking structure and the waveguide current conduction region. Because each of the components is flanked by current confinement regions of differing structures, the resistive and capacitative properties of the current confinement regions can be selected to optimise the performance of that component for a particular use.

19 Claims, 3 Drawing Sheets

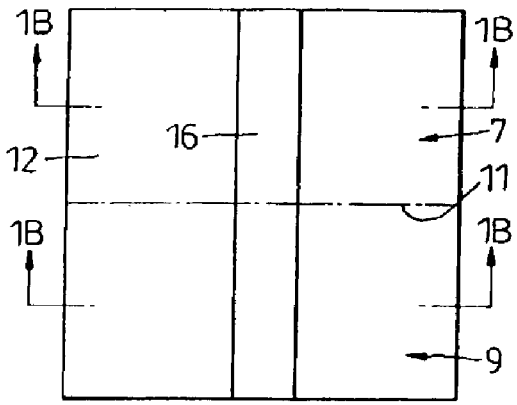
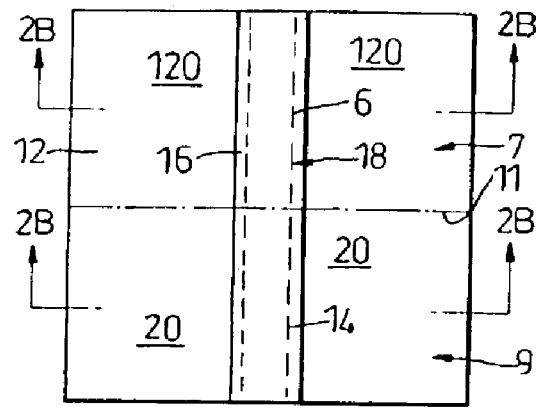
Fig. 1A  Fig. 2A
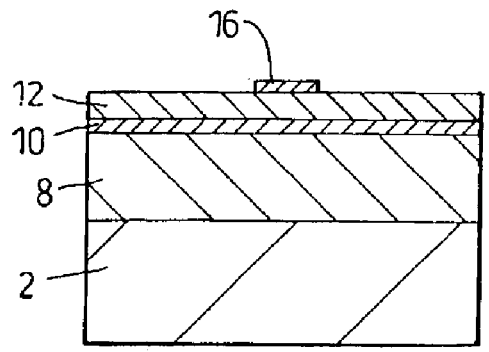
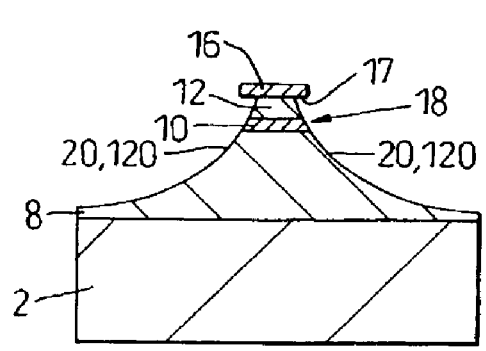
Fig. 1B  Fig. 2B
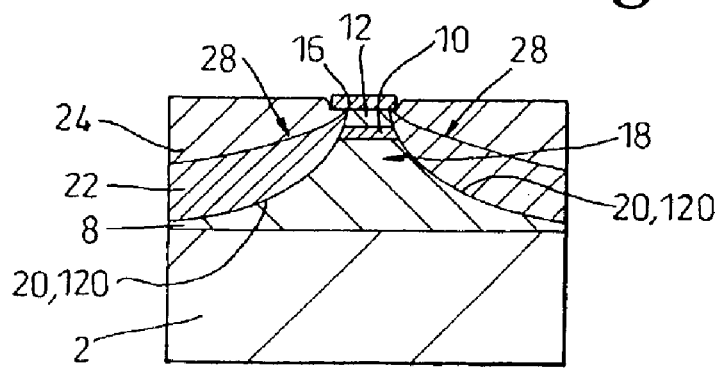
Fig. 3

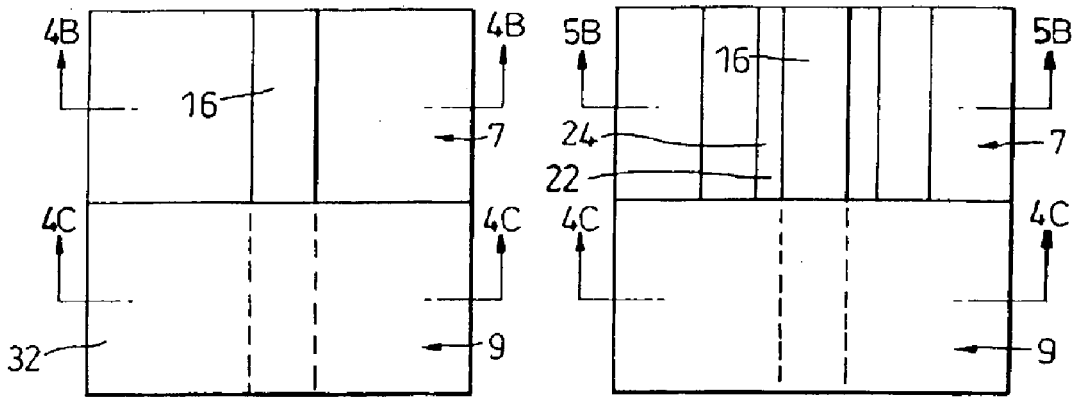
*Fig. 4A*     *Fig. 5A*
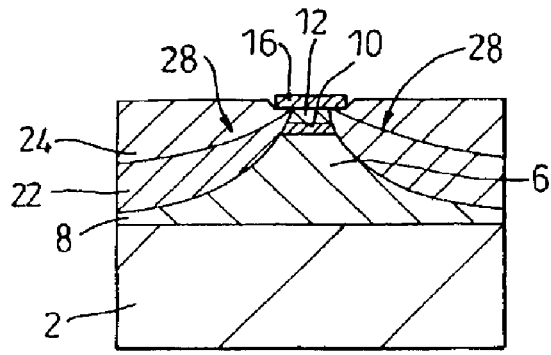 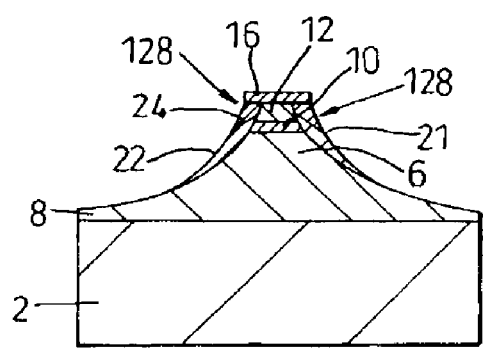
*Fig. 4B*     *Fig. 5B*
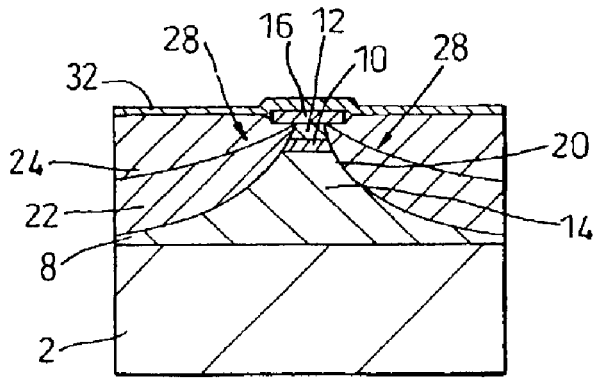
*Fig. 4C*

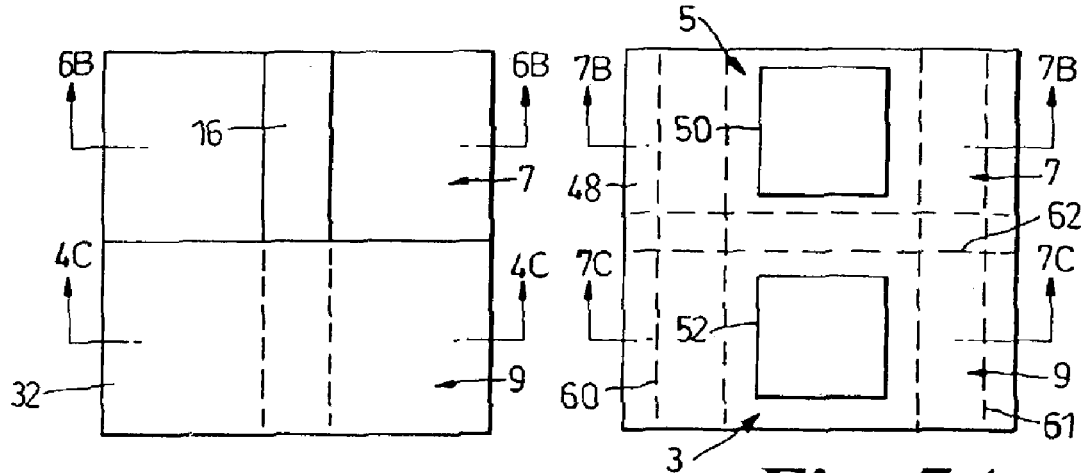
*Fig. 6A*  *Fig. 7A*
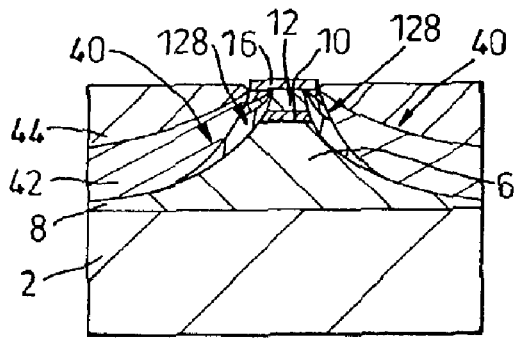
*Fig. 6B*
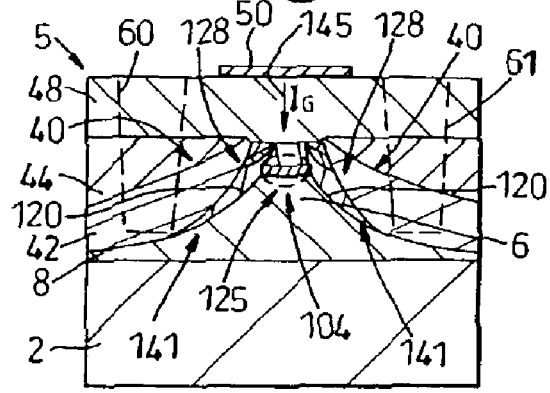
*Fig. 7B*
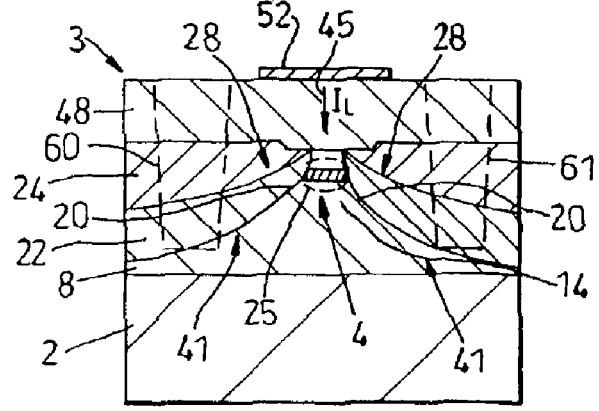
*Fig. 7C*

INTEGRATED SEMICONDUCTOR LASER AND WAVEGUIDE DEVICE

FIELD OF THE INVENTION

The present invention relates to an integrated semiconductor laser and waveguide device, and in particular a buried heterojunction laser that is optically coupled with a buried waveguide electro-absorption (EA) optical modulator.

BACKGROUND ART

It is known to fabricate, using a unitary III–V semiconductor substrate, an integrated semiconductor device having a laser and a waveguide EA modulator. The modulator is formed using either a ridge waveguide or a buried mesa waveguide. The optical radiation output from the laser, for example visible or infra-red radiation, can then be coupled optically into the EA modulator, which is then used to impart a high frequency modulation on the optical radiation generated by the laser. Fabricating a laser and waveguide device on the same substrate gives significant advantages in terms of ensuring alignment between the laser and waveguide components of the device. The components can then use the same epitaxially grown current confinement layers, which helps to simplify the manufacturing process.

In the field of transmitter devices for fibre-optic communication, operation is required at optical wavelengths ranging from 1.3 to 1.6 $\mu$m. Such opto-electronic transmitter devices are therefore usually fabricated from a wafer grown from an n-InP substrate on which are grown a number of layers, including an undoped InGaAsP active layer, which is typically either a bulk semiconductor or a multiple quantum well or dot structure sandwiched between an upper p-InP cladding layer and a lower n-InP buffer layer. A mask is applied to the upper cladding layer, and the surrounding layers are etched to leave a mesa structure. Buried heterostructure light emitting devices commonly have current confinement regions defined by areas of high resistivity to limit current flow. Such regions are grown to cover the sides of the mesa and so channel electric current to an optically active layer within the mesa structure.

A mask defining the mesa is then removed, and further layers are grown up to a p$^+$-InGaAs ternary cap layer. The ternary cap layer has a relatively low resistance and narrow bandgap facilitating electrical contact, and so serves as a contact layer to which electrical contacts may be made.

In devices using InGaAsP/InP materials, current confinement regions have often been employed based on a reverse-biased p-n or n-p diode structure. Such structures provide high resistance to current flow, and low leakage currents. These devices can also be directly modulated, and are widely used in fibre optic communication systems across a range of operating temperatures and at frequencies up to about 2.5 GHz.

In recent years there has been an increasing demand for fibre optic communication links having a bandwidth in excess of 2.5 GHz, for example up to at least 10 GHz. EA modulators can be used to achieve higher operating frequencies, but further limitations to operating frequency arise when an EA modulator is formed with the laser on the same substrate using the same current confinement structure. At operating frequencies above 2.5 GHz the performance of EA devices becomes limited by the capacitance of some of the conventional current blocking structures used by lasers. A lower capacitance structure that permits the EA modulator to operate at a high frequency may result in an additional current drawn by the laser, resulting in higher operating temperature. A laser can be stabilised against wavelength changes owing to temperature changes, for example by use of a distributed feedback grating, but temperature changes will adversely affect the performance of the EA modulator. It is possible to limit such temperature changes by use of a thermo-electric cooler, but this adds to the complexity and cost of the device.

It is an object of the present invention to provide a semiconductor device that addresses these issues.

SUMMARY OF THE INVENTION

According to one aspect of the invention, a semiconductor device comprises a semiconductor substrate and a plurality of semiconductor layers grown over the substrate that form a plurality of integrated optical components. The components include a buried heterojunction laser component and a waveguide component having an optical guiding structure. The laser component and the waveguide component include at least one active layer. The waveguide component is arranged to be optically coupled via the active layer with laser radiation generated by the laser component. The laser component includes a laser current conduction region and adjacent the laser current conduction region a laser current confinement region. The waveguide component includes a waveguide current conduction region and a waveguide current confinement region adjacent the waveguide current conduction region. The laser current confinement region comprises a first current blocking structure formed from grown semiconductor layers. The waveguide current confinement region comprises a second current blocking structure formed from grown semiconductor layers and includes an extension of the first current blocking structure. The extension is interposed between the second current blocking structure and the waveguide current conduction region.

According to another aspect of the invention, there is provided a method of forming a semiconductor device that comprises a semiconductor substrate over which a plurality of semiconductor layers including an active layer are deposited to form a plurality of integrated optical components. The components include a buried heterojunction laser component and a waveguide component. The waveguide component is arranged to be optically coupled via the active layer with laser radiation generated by the laser. The laser and waveguide component are formed from the semiconductor layers by:

i) forming at least one active layer;

ii) forming a laser current conduction region and a waveguide current conduction region;

iii) forming adjacent the active layer a first current blocking structure that extends adjacent both the laser component and the waveguide component;

iv) removing in the waveguide component the first current blocking structure except in a band adjacent the waveguide current conduction region; and v) forming in the waveguide component a second current blocking structure so that the band of the first current blocking structure is interposed between the second current blocking structure and the waveguide current conduction region.

Because each of the components is flanked by current confinement regions of differing structures, the resistive and capacitative properties of each of the current confinement regions can be selected to optimise the performance of that component for a particular use.

In a preferred embodiment of the invention, the waveguide component is an opto-electronic modulator, for example an electro-absorption (EA) modulator, for modulating the optical radiation generated by the laser.

By forming the device from a substrate that is common to both the laser component and the waveguide component, it is possible to (1) maintain the inherent advantages of an integrated device, while at the same time forming the laser current confinement region with a first current blocking structure that is optimised for good current blocking capability and hence a lower power consumption and running temperature, and (2) form, in the waveguide component, a second current blocking structure that is optimised for that component. For example, if the waveguide component is a modulator for high frequency modulation of a continuous laser output, the second current blocking structure can be optimised for lower capacitance in order to increase the operating frequency of the device. Although such a second current blocking structure may have a lower resistivity than the first current blocking structure, and hence potentially higher power consumption, a modulator such as an electro-absorption (EA) modulator requires a drive voltage and current which are significantly less than needed to drive a laser for a fibre-optic laser communication system.

In the case of a high frequency waveguide modulator, the contribution of the first current blocking structure to the overall capacitance of the waveguide current confinement region can be minimised by minimising the extent of the first current blocking structure as compared with the extent of the second current blocking structure.

This separates the waveguide from potentially adverse capacitive effects of the laser component current confinement region. It is then possible to optimise the performance of each current confinement region primarily with respect to the requirements of the respective component. For example, the laser current confinement region may include one or more reverse-biased p-n junctions or n-p junctions, which have good current blocking properties, but which may have excessive capacitance for high frequency operation of an EA modulator.

Therefore, the first current blocking structure may have a higher resistivity than the second current blocking structure. Also, a unit area of the second current blocking structure may have a lower capacitance than a unit area of the first current blocking structure.

A particular advantage of the invention is that it allows the use of a self-aligning manufacturing process. In a preferred embodiment of the invention, in which the waveguide component is a buried waveguide, the method comprises in step iii) the steps of: depositing a stripe mask above the laser current conduction region and waveguide current conduction region; etching the deposited semiconductor layers around and partially underneath the stripe mask to create a laser mesa and a waveguide mesa; and depositing the first current blocking structure against the mesas and underneath the stripe mask.

Step iv) then comprises the steps of: depositing a laser component mask above the first current blocking structure of the laser component; and etching the first current conduction structure in areas not covered by the stripe mask or the laser component mask to leave the band adjacent the waveguide current conduction region.

Step v) then comprises the step of depositing the second current blocking structure in areas not covered by the stripe mask or laser component mask.

The mesas are generally stripe mesas which are then flanked on either side by respective current confinement regions.

The invention can be used with known types of different first and second current confinement regions. For example, the first current blocking structure and/or the second current blocking structure may include a p-n junction or an n-p junction which in use is reverse-biased.

In a preferred embodiment of the invention, the laser component and the waveguide component each comprise a buried mesa stripe that includes the active layer. This results in good optical coupling between the components.

Each mesa stripe preferably has one or more side walls that rise above the substrate, the active layer extending to the side walls and the active layer being covered at the side walls by the first current blocking structure. The mesa side walls are then formed so they slope laterally away from the active layer. In the waveguide component this slope is towards the second current blocking structure. The boundary between the first current blocking structure and the second current blocking structure then has a steeper slope, or is more nearly vertical. A structure such as this helps to reduce the extent or volume of the first current blocking structure in the waveguide device, and hence minimises any adverse effects the first current blocking structure may impose on the waveguide device, for example by way of increasing the capacitance of the waveguide current confinement region.

In a preferred embodiment, one consequence of common processing steps in the formation of the laser component and the waveguide component is that the semiconductor layers that form the laser current conduction region also form a waveguide current conduction region to channel electric current to the active layer of the waveguide.

It may therefore be desirable to improve the electrical isolation of the components from one another if one or more trenches are etched transversely between the components and/or running laterally alongside the buried mesa stripes. In the case of a trench between the components, the trench is preferably formed in the semiconductor layers that lie above the active layer, but not through the active layer itself.

The integrated nature of the device allows for the use of process steps that are common between the various components. For example, the laser conduction region and the waveguide conduction region are preferably formed from the deposition of one or more of the same semiconductor layers. The layers that form the laser current conduction region then also form a waveguide current conduction region to channel electric current to the active layer of the waveguide.

One or more electric contact layers are then preferably deposited over the laser current conduction region and/or the waveguide current conduction region. At least one of these electrical contact layers provides an electrical contact for supplying electric current to the waveguide component.

BRIEF DESCRIPTION OF THE DRAWINGS

The invention will now be further described, by way of example only and with reference to the accompanying drawings, in which:

FIGS. 1A and 1B are respectively plan and cross-section views of a portion of a semiconductor wafer on which a plurality of semiconductor layers have been deposited, including an active layer, and over which a stripe mask has been deposited;

FIGS. 2A and 2B are respectively plan and cross-section views of the wafer of FIG. 1A, after etching of the deposited semiconductor layers not protected by the mask to create a stripe mesa beneath a partially undercut mask;

FIG. 3 is a cross-sectional view similar to that of FIG. 2B after deposition of a first current blocking structure adjacent the stripe mesa;

FIG. 4A is a plan view of the wafer of FIG. 3 after deposition of a second mask over one half of the first current blocking structure and stripe mask, the second mask covering a portion of the wafer destined to form a laser component, and the other half being destined to form an electro-absorption waveguide component;

FIGS. 4B and 4C are respectively, cross-sectional views through the waveguide portion and laser portion of the wafer of FIG. 4A;

FIGS. 5A and 5B are respectively a plan view of the wafer and a cross-sectional view of the waveguide portion of the wafer of FIG. 4A, after etching of the waveguide portion to remove most of the first current blocking structure in that portion except for a band immediately adjacent the active layer and beneath the partially undercut mask;

FIGS. 6A and 6B are respectively plan and cross-section views of the wafer of FIG. 5A after deposition in the unmasked areas of the waveguide portion of a second current blocking structure;

FIG. 7A is a plan view of a semiconductor device according to a preferred embodiment of the invention, being the wafer of FIG. 6A, after removal of the stripe and second masks and the subsequent deposition of a capping semiconductor layer and contact electrodes over the waveguide and laser portions; and FIGS. 7B and 7C are cross-sectional views respectively of the waveguide and laser portions of the semiconductor device of FIG. 7A.

DETAILED DESCRIPTION OF THE DRAWINGS

The optoelectronic semiconductor of FIGS. 1–7 is normally fabricated on a III–V semiconductor wafer along with a plurality of similar other such devices. Typically, such a III–V semiconductor wafer is about 32 mm square on a side. FIGS. 1A and 1B are plan and cross-sectional views, not to scale, of a portion of such a wafer, having an n-InP substrate 2 doped to around $10^{19}/cm^3$ on which is grown a number of III–V semiconductor layers, using well-known MOCVD techniques. The p-type dopant is zinc, and the n-type dopant is sulphur.

The first grown layer is a 2 $\mu$m thick n⁻-InP buffer layer 8 doped to around $10^{18}/cm^3$. An active layer 10 is grown on the buffer layer 8 according to known techniques for fabricating planar active lasers for a laser diode or an electro-absorption (EA) modulator device. The active layer could be a bulk region or a strained multiple quantum well (SMQW) structure; however the type of active layer employed is not critical.

In the present example, the layer 10 is used as the opto-electronically active layer in a buried heterojunction laser diode component 3, as well as a buried waveguide EA modulator component 5, as shown in FIGS. 7A, 7B and 7C. For convenience, these waveguide and laser portions 7,9 of the wafer are shown in FIGS. 1A and 2A divided by a dashed line 11. The process steps used to create the laser component 3 are shown in the lower half of FIGS. 1A, 2A, and 4A, 5A, 6A and 7A and in FIGS. 1B, 2B, 3, 4C and 7C. The process steps used to create the waveguide component 5 are as shown in the upper half of FIGS. 1A to 7A and in FIGS. 1B, 2B, 3, and 4B, 5B, 6B and 7B.

The active layer 10 has a quaternary $In_xGa_{1-x}As_{1-y}P_y$ structure that may be between about 100 nm to 300 nm thick.

The active layer 10 is topped by a cladding layer 12, formed from p⁺-InP, grown to be between about 100 nm to 1 $\mu$m thick.

Although not illustrated a DFB grating for the laser diode 3 can be contained in the n-InP buffer layer 8 or in the p-InP cladding layer 12.

Then, using well-known fabrication technology, the wafer is coated with a photolithographically patterned stripe mask 16 as shown in FIG. 1A. The stripe mask 16 is typically $SiO_2$ deposited by a plasma enhanced chemical vapour deposition (PECVD) process. In the present example, the dimensions of the stripe mask 16 are about 50 to 75 $\mu$m wide and 400 to 600 $\mu$m long.

Following the deposition of the stripe mask 16, the exposed deposited semiconductor layers 8,10,12 are etched in a wet-etch process that removes the capping layer 12, the active layer 10, and all but 200 nm of the buffer layer 8. The etch step leaves a stripe mesa 18 beneath the mask 16 that rises above the substrate 2 and which has opposite side walls 20, 120 that are nearly vertical beneath the mask 16, and which slope outwards beneath the outline of the silicon oxide mask 16 into the buffer layer 8. The mesa 18 forms in the waveguide portion 7 a waveguide mesa 6, and in the laser portion 9 a laser mesa 14.

Referring now also to FIGS. 7B and 7C, the waveguide mesa 6 and the laser mesa 14 each have left and right opposite side walls 20, 120 that together with the buffer layer 8 and the cladding 12 form a current conduction region 4;104 for an applied laser current ($I_L$) 45 or an applied waveguide voltage ($V_G$) 145, and have the effect of guiding an optical mode 25;125 along the active layer 10 from within the laser mesa 14 into the waveguide mesa 6. The current conduction regions of the laser and waveguide 4;104 extend both above and below the active layer 10.

As shown in FIG. 3, further semiconductor layers 22,24 are then grown on the etched exposed semiconductor layers 8,10,12 to form a first current blocking structure 28 that extends up to approximately the level of the oxide mask layer 16. The first current blocking structure 28 includes a first p-doped InP layer 22 using the element Zn as the dopant at a concentration of at least about $1 \times 10^{18}/cm^3$. Above layer 22 an n-doped InP layer 24 is grown using the element S directly on the p-type layer 22. The n-doped InP layer 24 preferably has a substantially constant dopant concentration at least as high as the highest dopant concentration in the p-type layer 22.

The thickness of the first p-doped layer 22 is about 0.5 $\mu$m to 1 $\mu$m, the thickness of the n-doped layer 24 is about 0.4 $\mu$m to 0.8 $\mu$m. The InP layers 22,24 form a p-n junction that in use is reverse-biased and hence insulating when the conduction region 4 is forward-biased.

As shown in FIGS. 4A and 4C, the wafer is again coated with an oxide mask and patterned so that a second mask layer 32, preferably formed from a similar $SiO_2$ material as the first mask layer 16, is deposited to mask or cover just the area 9 destined to form the laser component 3.

The unmasked areas of the waveguide portion 7 are again etched as shown in FIGS. 5A and 5B, either in a wet-etch or a reactive ion dry-etch process to remove most of the first current blocking structure 28 except along narrow bands 128 on opposite side walls 120 of the waveguide mesa 6. The stripe mask 16 remains in place during this etching process so that the area etched is automatically self-aligned with the formation of the original mesa structure 18 and the first current blocking structure 28. The etch process however is controlled to create steeper side walls 21, and so as not to undercut the stripe mask 16, thereby retaining the bands 128 of the first current blocking structure immediately adjacent the waveguide mesa 6.

A second current blocking structure 40 is then deposited adjacent the bands of first current blocking structure 128 in the unmasked waveguide portion 7 of the wafer. The second current blocking structure 40 is a semi-insulating structure, having a lower resistivity and a lower capacitance per unit area than the first current blocking structure 28;128. The lower capacitance allows the waveguide component to operate at higher frequencies, for example in excess of 10 GHz in order to modulate the continuous wave optical radiation 15 generated by the laser component 3.

The second current blocking structure 40 is formed from a first p-doped InP layer 42 using any of the elements Fe, Co or Ru as the dopant at a concentration of at least about $1 \times 10^{18}$ cm$^{-3}$ and above this an n-doped InP layer 44 grown directly on the p-type layer 42. The n-doped InP layer 44 includes sulphur and preferably has a substantially constant dopant concentration at least as high as the highest dopant concentration-in the p-type layer 42.

The thickness of the first p-doped layer 2 is about 0.8 $\mu$m to 1 $\mu$m, the thickness of the n-doped layer 44 is about 0.4 $\mu$m to 0.6 $\mu$m. The InP layers 42,44 form a low-capacitance p-n junction that in use is reverse-biased and hence semi-insulating when the conduction region 4 is forward-biased.

In FIGS. 7A, 7B and 7C, the first current blocking structure 28 in the laser portion 9 of the device forms a current confinement region 41 for the laser component 3, and the second current blocking structure 40 and the band of first current blocking structure 128 interposed between the waveguide mesa 14 and the second current blocking structure 40 together form a current confinement region 141 for the waveguide component 5.

After deposition of the second current blocking structure 40, the SiO$_2$ mask layers 16,32 are removed in a wet-etch process to expose the cladding layer 12 of the waveguide and laser mesas 6,14 as well as the first current blocking structure 28 in the laser portion 9 of the device.

An upper cladding layer 48 formed from Zn-doped p$^+$-InP is then grown above the exposed "lower" cladding layer 12 above the mesas 6,14 and above the current blocking structures 28;40,128 to a thickness of about 2 $\mu$m to 3 $\mu$m. The upper cladding layer 48 forms a uniform, flat layer extending fully across the waveguide portion 7 and the laser portion 9 of the device.

Optionally, a final 100 nm to 200 nm thick ternary cap layer (not shown) formed from p$^{++}$-GaInAs, highly doped to around 10$^{19}$/cm$^3$, is deposited on the cladding layer 32 to facilitate good ohmic contacts. As an alternative to a ternary cap layer, it is possible to use a quaternary InGaAsP cap layer, or both InGaAsP and InGaAs layers.

Standard metal layers are then vacuum coated on the exposed upper cladding layer 48. The metal coating is then photolithographically patterned using well-known techniques, to leave two contact pads, one pad 50 above the waveguide mesa 6 and the other pad 52 above the laser mesa 14.

Electrical current 45,145 can then be supplied via electrical connections (not shown) to the contact pads 52,50 to drive the laser device 3 or to modulate the EA waveguide device 5.

The resulting wafer is then thinned to a thickness of about 70 $\mu$m to 100 $\mu$m in a standard way, in order to assist with cleaving. Standard metal layers (not shown) are then deposited by sputtering on the rear surface of the wafer, for enabling electrical contact to be made to the n-side of the devices.

The wafer is then inscribed and cleaved in a conventional process, first transversely into bars about 600 to 700 $\mu$m wide, and then each bar is cleaved into individual devices 200 $\mu$m wide. The resulting cleaved device is about 600 to 700 $\mu$m long (i.e. in the direction of the laser mesa 14 and waveguide 6) and about 200 $\mu$m wide.

Although not shown, after testing the device 1 can be packaged in an industry standard package, with a single mode optical fibre coupled with a spherical lens to an output facet of the EA modulator 3, and with gold bond wires soldered onto the metalised contact pads 50,52.

A significant advantage of the invention is that the laser mesa 14 is directly adjacent and self-aligned with respect to the waveguide mesa 6, because of the initial patterning of the oxide layer 16 as shown in FIG. 1A.

Because the laser component 3 and EA component 5 are integrated components formed on a common substrate 2, the structures of FIGS. 1–7 avoid the difficulty of having to align and join together two individual devices formed from different substrates.

Optionally, as shown in FIG. 7A in dashed outline, one or more trenches 60,61,62 are etched in the upper cladding layer 32, either a transverse trench 62 between the waveguide component 5 and laser component 3 or trenches 60,61 that are parallel to each other and to the waveguide and laser mesas 6,14, in order to provide increased electrical isolation between the two components 3,5. Although the parallel trenches 60,61 are preferably formed in the semiconductor layers 2,8,42,44,48 that lie both above and below the active layer 10, the transverse trench 62 should only extend in the semiconductor layers above the active layer 10 and not through to the active layer itself.

The InGaAsP/InP components 3,5 described above therefore incorporate different current blocking structures. The layers used to form the laser current confinement region 28 adjacent the laser component 3 do not contribute significantly to the capacitance of the waveguide current confinement region 141. This allows each current confinement region 41,141 to be optimised according the requirements of each corresponding component 3,5. Therefore, the structure provides a high resistivity current confinement region 28 adjacent the laser mesa 14, having low leakage currents across a wide range of operating temperatures, as well as a relatively low capacitance current confinement region 141 adjacent the EA waveguide mesa 6. The structure also permits the use of higher drive voltages in the waveguide 5, which is useful in achieving high-speed operation.

Semiconductor devices as described provide a high operating bandwidth and good lifetime characteristics. The process steps involved are similar to other standard steps used in the fabrication of such devices. There is no need for additional expensive processing equipment.

The structure is therefore particularly useful for a buried heterostructure laser diode combined with an EA modulator suitable for use as a transmitter in a high speed fibre-optic link operating at 10 Gbits/s or more at a wavelength between 1.27 and 1.6 $\mu$m.

Although the present invention has been described specifically for the example of a laser diode and an EA modulator, the invention is applicable to any integrated opto-electronic semiconductor devices where different current blocking regions are needed to help channel current to different components. Examples include ridge waveguide type lasers, pump lasers, edge emitting light emitting diodes, surface emitting laser and light emitting diodes. Another example is an optical waveguide with a split into two waveguides at a Y-junction. The waveguide can have electrically driven or modulated active optical regions in two or three of the arms of the "Y", for example an optical amplifier or modulator. It may then be desirable to provide a current blocking region at the junction of the three arms, where there are three separate conduction regions.

The structure described above has been described for a device based on an n-InP substrate, having a first current blocking structure formed from a reverse-biased p-n junction in laterally adjacent contact with the active layer structure. However, it is to be appreciated that the invention can also be applied to other types of devices, for example those based on a p-InP substrate.

What is claimed is:

1. A semiconductor device, comprising a semiconductor substrate and a plurality of semiconductor layers grown over said substrate that form a plurality of integrated optical components, said components including a buried heterojunction laser component and a waveguide component having an optically guiding structure;

the laser component and the waveguide component including at least one active layer, the waveguide component being arranged to be optically coupled via said active layer with laser radiation generated by the laser component;

the laser component including a laser current conduction region and adjacent said laser current conduction region a laser current confinement region;

the waveguide component including a waveguide current conduction region and adjacent said waveguide current conduction region a waveguide current confinement region;

the laser current confinement region comprising a first current blocking structure formed from grown semiconductor layers; and the waveguide current confinement region comprising a second current blocking structure formed from grown semiconductor layers and including an extension of the first current blocking structure, said extension being interposed between the second current blocking structure and the waveguide current conduction region.

2. A semiconductor device as claimed in claim 1, wherein the first current blocking structure has a higher resistivity than the second current blocking structure.

3. A semiconductor device as claimed in claim 2, wherein a unit area of the second current blocking structure has a lower capacitance than a unit area of the first current blocking structure.

4. A semiconductor device as claimed in claim 3, wherein at least one of the first current blocking structure and the second current blocking structure includes a p-n junction or an n-p junction adapted to be reverse-biased in use.

5. A semiconductor device as claimed in claim 4, wherein the laser component and the waveguide component each comprise a buried mesa stripe that includes the active layer.

6. A semiconductor device as claimed in claim 5, wherein each mesa stripe has one or more side walls that rise above the substrate, the active layer extending to the side walls and the active layer being covered at the side walls by the first current blocking structure.

7. A semiconductor device as claimed in claim 6, wherein the mesa side walls slope laterally away from the active layer.

8. A semiconductor device as claimed in claim 7, wherein the waveguide component is an opto-electronic modulator for modulating the optical radiation generated by the laser component.

9. A semiconductor device as claimed in claim 8, wherein the semiconductor layers that form the laser current conduction region also form a waveguide current conduction region for channelling an electric signal to the active layer of the waveguide.

10. A semiconductor device as claimed in claim 9, wherein a trench lies between the waveguide component and laser component, said trench being formed in the semiconductor layers that lie above the active layer, but not through the active layer itself.

11. A semiconductor device as claimed in claim 1, wherein a unit area of the second current blocking structure has a lower capacitance than a unit area of the first current blocking structure.

12. A semiconductor device as claimed in claim 1, wherein at least one of the first current blocking structure and the second current blocking structure includes a p-n junction or an n-p junction adapted to be reverse-biased in use.

13. A semiconductor device as claimed in claim 1, wherein the laser component and the waveguide component each comprise a buried mesa stripe that includes the active layer.

14. A semiconductor device as claimed in claim 1, wherein the waveguide component is an opto-electronic modulator for modulating the optical radiation generated by the laser component.

15. A semiconductor device as claimed in claim 1, wherein the semiconductor layers that form the laser current conduction region also form a waveguide current conduction region for channelling an electric signal to the active layer of the waveguide.

16. A semiconductor device as claimed in claim 1, wherein a trench lies between the waveguide component and laser component, said trench being formed in the semiconductor layers that lie above the active layer, but not through the active layer itself.

17. A method of forming a semiconductor device, said device comprising a semiconductor substrate over which a plurality of semiconductor layers including an active layer are deposited to form a plurality of integrated optical components, said components including a buried heterojunction laser component and a waveguide component, the waveguide component being arranged to be optically coupled via said active layer with laser radiation generated by the laser, forming the laser and waveguide component from said semiconductor layers by the steps comprising:

i) forming at least one active layer;

ii) forming a laser current conduction region and a waveguide current conduction region;

iii) forming adjacent the active layer a first current blocking structure that extends adjacent both the laser component and the waveguide component;

iv) removing from the waveguide component the first current blocking structure except in a band adjacent the waveguide current conduction region; and v) forming in the waveguide component a second current blocking structure so that said band of the first current blocking structure is interposed between the second current blocking structure and the waveguide current conduction region.

18. A method as claimed in claim 17, in which step iii) comprises the steps of:

depositing a stripe mask above said laser current conduction region and waveguide current conduction region;

creating a laser mesa and a waveguide mesa by etching said deposited semiconductor layers around and partially underneath said stripe mask;

depositing said first current blocking structure against said mesas and underneath said mask;

then depositing a laser component mask above the first current blocking structure of the laser component;

etching said first current conduction structure in areas not covered by said stripe mask or said laser component mask to leave said band adjacent the waveguide current conduction region; and then depositing said second current blocking structure in areas not covered by said stripe mask or laser component mask.

19. A semiconductor device, comprising a semiconductor substrate and a plurality of semiconductor layers on said substrate that comprise a plurality of integrated optical components, said components including a buried heterojunction laser component and a waveguide component having an optically guiding structure;

the laser component and the waveguide component including at least one active layer, the waveguide component being arranged to be optically coupled via said active layer with laser radiation generated by the laser component;

the laser component including a laser current conduction region and adjacent said laser current conduction region a laser current confinement region;

the waveguide component including a waveguide current conduction region and adjacent said waveguide current conduction region a waveguide current confinement region;

the laser current confinement region comprising a first semiconductor layer current blocking structure; and the waveguide current confinement region comprising a second semiconductor layer current blocking structure and including an extension of the first current blocking structure, said extension being interposed between the second current blocking structure and the waveguide current conduction region.

* * * * *